(12) United States Patent
Hamouda

(10) Patent No.: US 8,881,069 B1
(45) Date of Patent: Nov. 4, 2014

(54) PROCESS ENHANCING SAFE SRAF PRINTING USING ETCH AWARE PRINT AVOIDANCE

(71) Applicant: GLOBALFOUNDRIES Inc., Grand Cayman (KY)

(72) Inventor: Ayman Hamouda, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/964,022

(22) Filed: Aug. 9, 2013

(51) Int. Cl.
*G06F 17/50* (2006.01)

(52) U.S. Cl.
CPC ........ *G06F 17/5081* (2013.01); *G06F 17/5072* (2013.01)
USPC ............................................. 716/53; 716/54

(58) Field of Classification Search
CPC .............................. G03F 1/144; G03F 17/5068
USPC ........................................................ 716/53, 54
See application file for complete search history.

(56) References Cited

U.S. PATENT DOCUMENTS

| | | | |
|---|---|---|---|
| 2012/0183906 A1* | 7/2012 | Kodama et al. | 430/319 |
| 2013/0275926 A1* | 10/2013 | Wang et al. | 716/53 |
| 2013/0311960 A1* | 11/2013 | Tsai et al. | 716/55 |

* cited by examiner

*Primary Examiner* — Suresh Memula
(74) *Attorney, Agent, or Firm* — Ditthavong & Steiner, P.C.

(57) ABSTRACT

A method of SRAF printing using etch-aware SRAF print avoidance engines and the resulting device are provided. Embodiments include performing mask to resist simulations for a mask having both a plurality of features to be formed on a substrate and a plurality of sub resolution assist features (SRAFs); detecting SRAFs of the plurality that will print through to a resist; checking dimensions of the detected SRAFs to determine whether one or more of the SRAFs will etch through to the substrate; modifying the one or more of the SRAFs; and forming the mask after the one or more of the SRAFs have been modified.

18 Claims, 3 Drawing Sheets

PROCESS ENHANCING SAFE SRAF PRINTING USING ETCH AWARE PRINT AVOIDANCE

TECHNICAL FIELD

The present disclosure relates to photolithographic processing using sub resolution assist features (SRAFs). The present disclose is particularly applicable to deep ultraviolet light (DUV) technologies for 32 nanometer (nm) technology nodes and beyond.

BACKGROUND

Photolithographic masks are used to fabricate semiconductor devices such as integrated circuits. The masks are patterned according to the images that are to be printed on, for example, a silicon wafer. Light is transmitted through the openings in the mask and focused onto a photoresist layer that has been coated on the silicon wafer. The transmitted and focused light exposes portions of the photoresist. A developer is used to remove either the exposed portions or the unexposed portions of the resist layer, depending on whether the photoresist is a positive or negative type resist. The remaining photoresist serves to protect the underlying layer during further processing of the wafer (e.g., etching exposed portions of the underlying layer, implanting ions into the wafer, etc.). After the wafer fabrication process for this pattern is performed, the remaining portion of the photoresist layer can be removed from the underlying substrate. The pattern that is printed onto the photoresist correlates with that of the photolithographic mask.

There is a continuing objective to increase the density with which various integrated circuit structures are arranged. As technology nodes decrease, the critical dimension of the features to be printed on the silicon wafer is reduced. As the size of the features becomes smaller than the wavelength of light, distortions occur in the printed patterns. To reduce these distortions, SRAFs are added to the mask between the features to be printed. SRAFs generally are not printed on the semiconductor wafer, but help to balance the optical density of the feature pattern.

SRAFs are placed on a mask in proximity to optical proximity correction (OPC) shapes to assist/improve the photolithography process. In particular, placing SRAFs on a mask improves the process window (PW). It is desirable to use an aggressive SRAF insertion strategy to improve both the imaging quality during photolithography and also the pattern transfer immunity against photolithography process variations. However, a too aggressive insertion strategy may lead to printing and etching of the SRAFs such that the SRAFs can become defects that contribute to random defect generation. This is especially true when a printed SRAF forms a resist line. Moreover, multiple stacked printed SRAFs in integrated levels can form an actual electrical path to signals that can alter (and even destroy) the circuit behavior.

A known approach involves using a second exposure for trimming/removing the printed assist features. For example, in some layers like Poly in 32 nm, 28 nm, and 20 nm technologies, it has been suggested to make the required final design on a gridded pitch, where the resolution enhancement technologies (RET) (illumination/source distribution) are optimized specifically for a particular pitch as illustrated in FIG. 1. In particular, a trim mask 101 is formed on either side of the original design 103, and the trim mask 101 includes printing assist features 105 that are similar in dimension and pitch to the original design 103. Because these technologies use a trim mask 103, assisting features 105 can be printed, as they are then removed later using the trimming phase. While there is proof of the benefit of printing SRAFs with this process, this technique is limited to technologies with a trim mask.

A need therefore exists for a methodology enabling an aggressive SRAF strategy with SRAF printing during the photolithography process, but without the need for a trim mask.

SUMMARY

An aspect of the present disclosure is a method of SRAF printing (SSP) using etch-aware SRAF print avoidance (SPA) engines.

Another aspect of the present disclosure is a device including SRAFs that are less than a dimension that will etch through to a substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: performing mask to resist simulations for a mask having both a plurality of features to be formed on a substrate and a plurality of SRAFs; detecting SRAFs of the plurality that will print through to a resist; checking dimensions of the detected SRAFs to determine whether one or more of the SRAFs will etch through to the substrate; modifying the one or more of the SRAFs; and forming the mask after the one or more of the SRAFs have been modified.

Aspects of the present disclosure include performing the simulations by: performing an optical simulation; performing a resist chemistry simulation; and performing an etch process simulation. Further aspects include performing the simulations sequentially. Another aspect includes creating a calibrated printing SRAF model that is capable of predicting the SRAFs that will print through to a resist prior to the simulations. Other aspects include creating the calibrated printing SRAF model by: collecting different scanning electron microscope (SEM) images of other SRAFs that will print through to a resist and other SRAFs that will not print through to the resist. Additional aspects include checking the dimensions of the detected SRAFs during an OPC step. Further aspects include maintaining SRAFs that are smaller than one or more dimension controls, wherein the one or more dimension controls include a circle or an ellipse of a dimension less than what will etch through to the substrate and/or a line of a maximum line width less than what will etch through to the substrate. Another aspect includes modifying the one or more of the SRAFs by: reducing the size of the one or more of the SRAFs to be less than what will etch through to the substrate or by removing the one or more of the SRAFs from the mask.

Another aspect of the present disclosure is a device including: a mask having both a plurality of features to be formed on a substrate and a plurality of SRAFs, wherein the dimensions of the SRAFs are less than a dimension that will etch through to the substrate.

Another aspect of the present disclosure is a method including: simulating lithographic processes on a mask having both a plurality of features to-be-formed on a substrate and a plurality of SRAFs; detecting SRAFs of the plurality that will print through to a resist; simulating a first etch process on the SRAFs to determine whether one or more of the SRAFs will etch through to the substrate; modifying the one or more of the SRAFs; and forming the mask after the one or more of the SRAFs have been modified. Further aspects include simulating the lithographic processes by: performing an optical simulation; performing a resist chemistry simulation; and performing a second etch process simulation. Another aspect includes performing the lithographic processes sequentially. Other aspects include simulating the first etch process by: placing an etch simulation point on a resist contour of each of the SRAFs. Additional aspects include simulating a third etch process for the plurality of features to determine density calculations. Further aspects include simulating the first etch process by: placing an etch simulation point on a respective resist contour of each of the plurality of features and each of the plurality of SRAFs. Another aspect includes simulating the first etch process during an OPC step. Other aspects include modifying the one or more of the SRAFs by: reducing the size of the one or more of the SRAFs to be less than what will etch through to the substrate or by removing the one or more of the SRAFs from the mask. Additional aspects include iteratively decreasing dimensions of the plurality of SRAFs until a maximum size of the plurality of SRAFs is reached that will print through to the resist, but will not etch through to the substrate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of SRAFs being printed and etched, thereby contributing to random defect generation for some levels, attendant upon aggressively employing assist features with photolithography. Such defects, when stacked in integrated levels, can form an actual electric path to signals that can alter (and even destroy) the circuit behavior.

Methodology in accordance with embodiments of the present disclosure includes performing mask to resist simulations for a mask having both a plurality of features to be formed on a substrate and a plurality of SRAFs. SRAFs of the plurality that will print through to a resist are detected. Dimensions of the detected SRAFs are checked to determine whether one or more of the SRAFs will etch through to the substrate. The one or more of the SRAFs are modified. The mask is formed after the one or more of the SRAFs have been modified.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
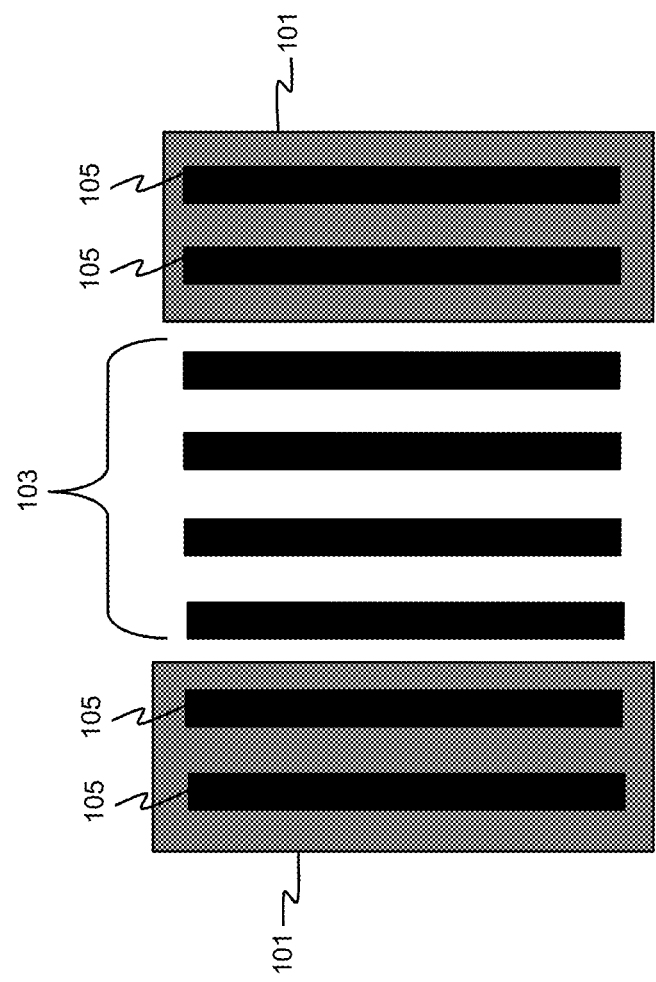
FIG. 1 is a schematic diagram of a background method of using printing assist features in connection with a trim mask.
Figure 2:
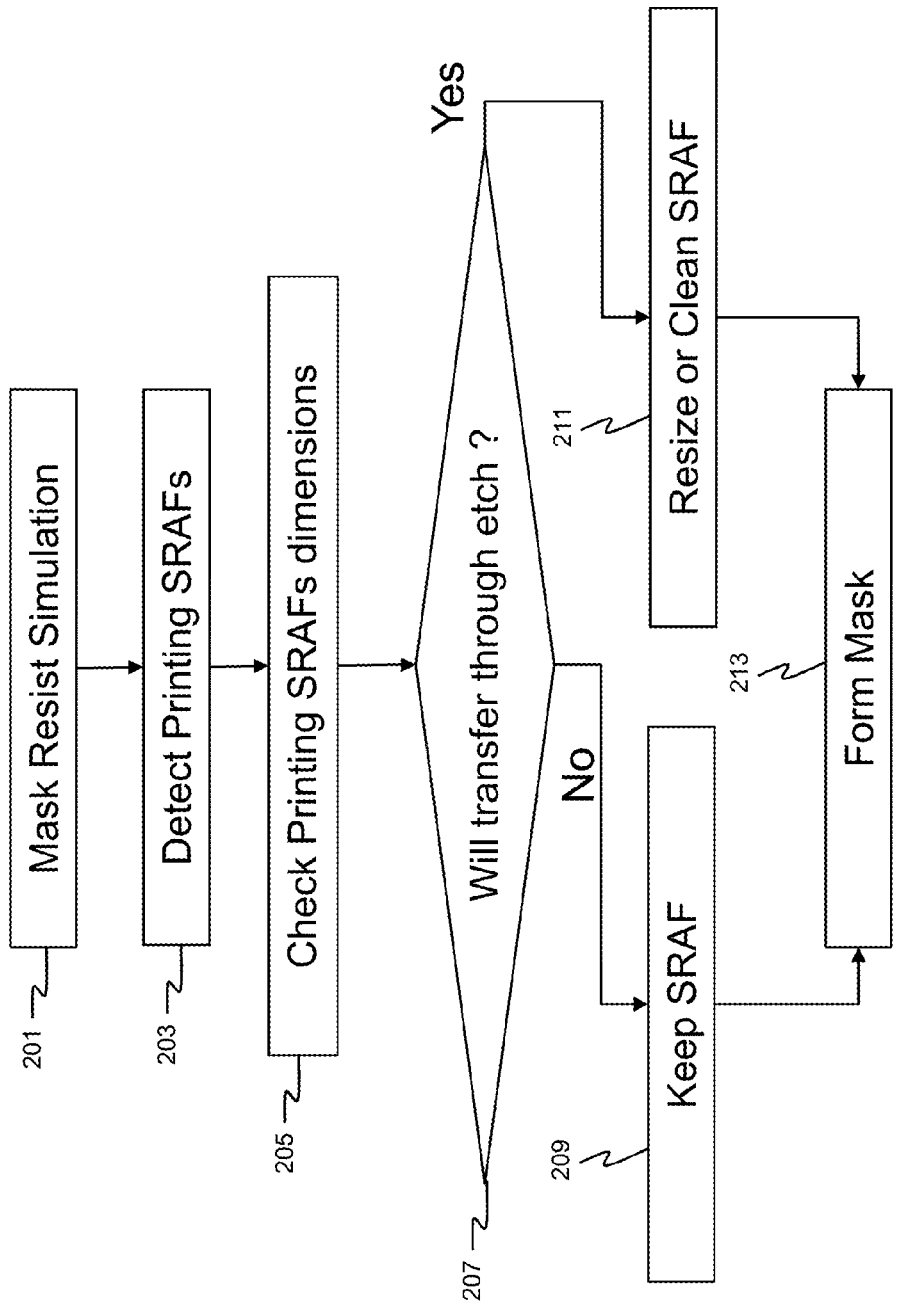
FIG. 2 illustrates a process flow for forming a photolithographic mask using a SSP methodology including a dimension checking etch-aware SPA engine, in accordance with an exemplary embodiment of the present disclosure.

FIG. 2 illustrates a process flow for forming a photolithographic mask using a SSP methodology including a dimension checking etch-aware SPA engine, in accordance with an exemplary embodiment of the present disclosure. Adverting to step 201, mask to resist simulations for a mask having both a plurality of features to be formed on a substrate and a plurality of SRAFs are performed. More specifically, the simulations performed in sequential order include an optical simulation to evaluate all diffraction and imagining effects from the mask into a resist or resist stack; a resist chemistry simulation to evaluate how the imaging inside of the resist occurs; and an etch process simulation to evaluate the final printing on the substrate.

In step 203, SRAFs from the mask that will print through to the resist are detected. In particular, the detection process includes creating a calibrated printing SRAF model, e.g., a calibrated constant threshold resist (CTR) model that is capable of predicting the SRAFs that will print through to the resist, prior to running the simulations. Specifically, the calibrated printing SRAF model is created by collecting different SEM images of other SRAFs that will print through to a resist and other SRAFs that will not print through to the resist.

Adverting to step 205, the dimensions of the detected SRAFs, i.e., the SRAFs that will print through to the resist, are checked to determine whether one or more of the SRAFs will etch through to the substrate. In particular, this step occurs during an OPC step. In step 207, if the SRAFs are smaller than one or more dimension controls, and, therefore, will not etch through to the substrate, then the SRAFs are maintained in step 209. The one or more dimension controls may include, for example, a circle or an ellipse having dimensions less than what will etch through to the substrate and/or a line having a maximum line width less than what will etch through to the substrate.

However, if the detected SRAFs are not smaller than the one or more dimension controls in step 207, then those SRAFs are modified in step 211 either by reducing their size to be less than a dimension that will etch through to the substrate or by removing them from the mask. More specifically, the dimensions of the SRAFs are decreased until a maximum size is reached that will print through to the resist, but will not etch through to the substrate. Once the SRAFs have been modified in step 211, the mask may be formed in step 213.

Figure 3:
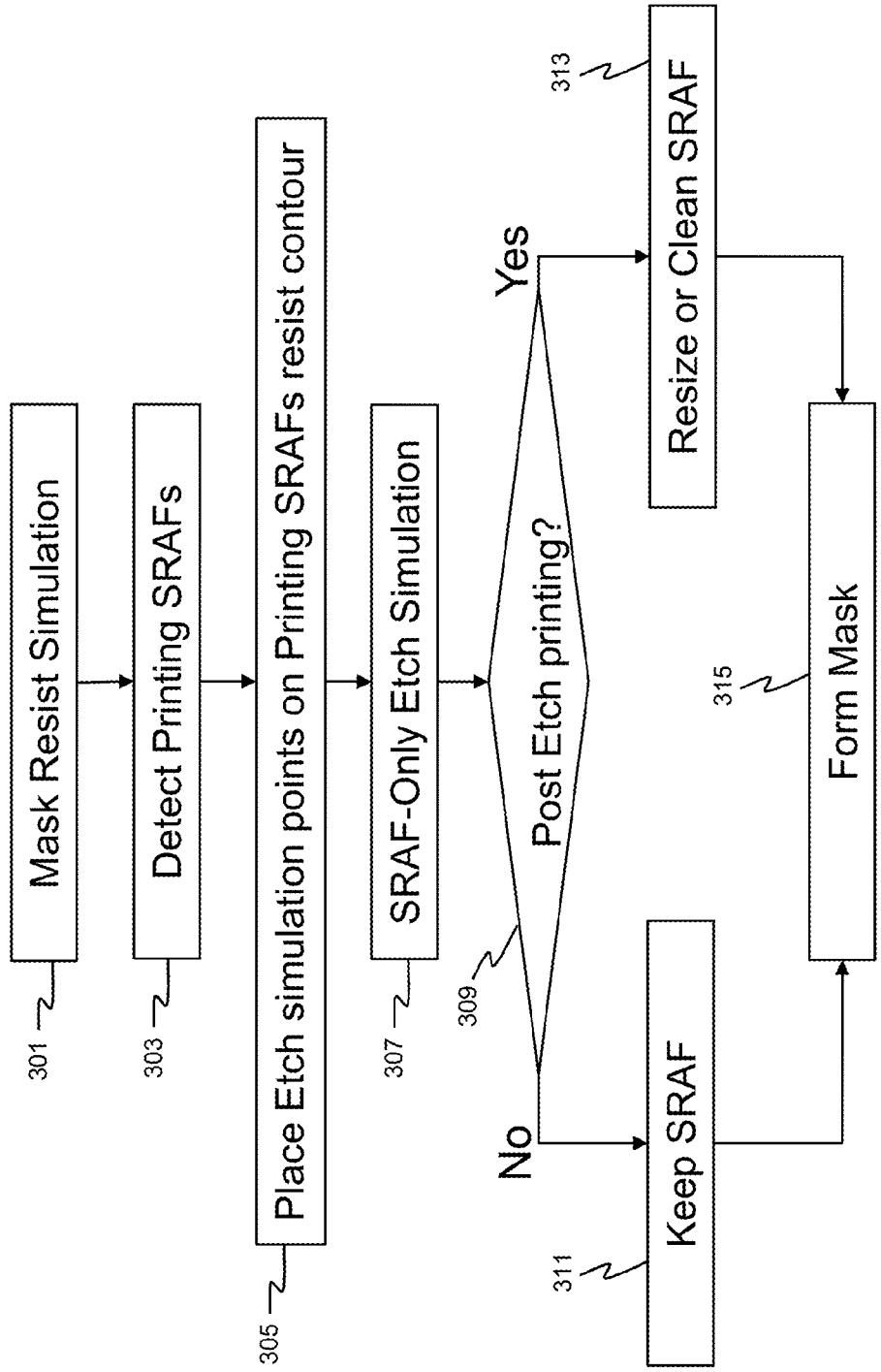
FIG. 3 illustrates a process flow for forming a photolithographic mask using a SSP methodology including a SRAF etch simulation etch-aware SPA engine, in accordance with an exemplary embodiment of the present disclosure.

FIG. 3 illustrates a process flow for forming a photolithographic mask using a SSP methodology including a SRAF etch simulation etch-aware SPA engine, in accordance with an exemplary embodiment of the present disclosure. Adverting to step 301, lithographic processes are simulated on a mask having both a plurality of features to-be-formed on a substrate and a plurality of SRAFs. As with FIG. 2, the lithographic processes include an optical simulation, a resist chemistry simulation, and a second etch process, and the simulations are performed sequentially on the mask.

In step 303, the SRAFs that will print through to a resist are detected. Similar to step 203 of FIG. 2, the detection process of FIG. 3 includes creating a calibrated printing SRAF model, e.g., a CTR model that is capable of predicting the SRAFs that will print through to the resist, prior to running the simulations. Thereafter, in step 305, a first etch process is simulated on the SRAFs that will print through to the resist to determine whether one or more the SRAFs will etch through to the substrate.

Adverting to step 307, the first etch process is simulated by placing an etch simulation point only on a resist contour of each of the SRAFs. Consequently, a third etch process is simulated for the plurality of to-be-formed features to determine only density calculations of the features, which will make the first etch process considerably faster. Similar to the dimensions checking process of step 205 of FIG. 2, the first etch process of step 307 is simulated during an OPC step. More specifically, applying an etch simulation point only on each of the SRAFs is compatible with currently available commercial etch simulations and may be efficient due to the size of the SRAFs, because etch simulations are usually contour based, and lithographic printing SRAFs are supposed to have a minimum contour size. Alternatively, the first etch process can be simulated by placing an etch simulation point on a respective resist contour of each of the plurality of features and each of the plurality of SRAFs (not shown for illustrative convenience). However, applying an etch simulation point everywhere is computationally expensive.

In step 309, if the first etch process simulation determines that the SRAFs are smaller than a dimension that will etch through to the substrate, then, in step 311, the SRAFs are maintained on the mask. However, if the first etch process simulation determines that the SRAFs are larger than a dimension that will etch through to the substrate, then, in step 313, the SRAFs are modified either by reducing their size to be less than a dimension that will etch through to the substrate or by removing the SRAFs from the mask. Again, similar to the process described in FIG. 2, the dimensions of the plurality of SRAFs are iteratively decreased until a maximum size is reached that will print through to the resist, but that will not etch through to the substrate. Once the SRAFs have been modified in step 313, the mask may be formed in step 315.

The embodiments of the present disclosure can achieve several technical effects, including a noticeable improvement of the process window (PW). More specifically, both the process variation (PV) band width and the depth of focus (DoF) are improved. By way of example, in an example use case where the PV band is generally 6.5 nm, and the DoF is generally 106 mm, the methodologies discussed in FIGS. 2 and 3 can reduce the PV band to 5.69 nm, representing approximately a 12.5% improvement, and can increase the DoF to 138 mm, representing approximately a 30% improvement. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability for DUV technologies for 32 nm technologies and beyond, and will also be applicable to EUV technologies as they begin to employ SRAFs in processing.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
performing mask to resist simulations for a mask having both a plurality of features to be formed on a substrate and a plurality of sub resolution assist features (SRAFs);
detecting SRAFs of the plurality that will print through to a resist;
checking dimensions of the detected SRAFs to determine whether one or more of the SRAFs will etch through to the substrate;
decreasing the dimensions of one or more of the plurality of SRAFs iteratively until a maximum size of the plurality of SRAFs is reached that will print through to the resist, but will not etch through to the substrate; and
forming the mask after the one or more of the SRAFs have been modified.

2. The method according to claim 1, comprising performing the simulations by:
performing an optical simulation;
performing a resist chemistry simulation; and
performing an etch process simulation.

3. The method according to claim 2, wherein the simulations are performed sequentially.

4. The method according to claim 1, further comprising creating a calibrated printing SRAF model that is capable of predicting the SRAFs that will print through to a resist prior to the simulations.

5. The method according to claim 4, comprising creating the calibrated printing SRAF model by:
collecting different scanning electron microscope (SEM) images of other SRAFs that will print through to a resist and other SRAFs that will not print through to the resist.

6. The method according to claim 1, comprising checking the dimensions of the detected SRAFs during an optical proximity correction (OPC) step.

7. The method according to claim 1, further comprising maintaining SRAFs that are smaller than one or more dimension controls.

8. The method according to claim 7, wherein the one or more dimension controls include a circle or an ellipse of a dimension less than what will etch through to the substrate and/or a line of a maximum line width less than what will etch through to the substrate.

9. The method according to claim 1, comprising decreasing the dimensions of the one or more of the SRAFs by:

reducing the size of the one or more of the SRAFs to be less than what will etch through to the substrate or by removing the one or more of the SRAFs from the mask.

10. A device comprising:
a mask having both a plurality of features to be formed on a substrate and a plurality of sub resolution assist features (SRAFs),
wherein one or more of the plurality of SRAFs will print through to the resist, but will not etch through to the substrate.

11. A method comprising:
simulating lithographic processes on a mask having both a plurality of features to-be-formed on a substrate and a plurality of sub resolution assist features (SRAFs);
detecting SRAFs of the plurality that will print through to a resist;
simulating a first etch process on the SRAFs to determine whether one or more of the SRAFs will etch through to the substrate;
decreasing the dimensions of one or more of the plurality of SRAFs iteratively until a maximum size of the plurality of SRAFs is reached that will print through to the resist, but will not etch through to the substrate; and
forming the mask after the one or more of the SRAFs have been modified.

12. The method according to claim 11, comprising simulating the lithographic processes by:
performing an optical simulation;
performing a resist chemistry simulation; and
performing a second etch process simulation.

13. The method according to claim 12, wherein the lithographic processes are performed sequentially.

14. The method according to claim 11, comprising simulating the first etch process by:
placing an etch simulation point on a resist contour of each of the SRAFs.

15. The method according to claim 14, further comprising simulating a third etch process for the plurality of features to determine density calculations.

16. The method according to claim 11, comprising simulating the first etch process by:
placing an etch simulation point on a respective resist contour of each of the plurality of features and each of the plurality of SRAFs.

17. The method according to claim 11, comprising simulating the first etch process during an optical proximity correction (OPC) step.

18. The method according to claim 11, comprising decreasing the dimensions of the one or more of the SRAFs by:
reducing the size of the one or more of the SRAFs to be less than what will etch through to the substrate or by removing the one or more of the SRAFs from the mask.

* * * * *